United States Patent [19]

Sandhu et al.

[11] Patent Number: 5,409,587
[45] Date of Patent: Apr. 25, 1995

[54] SPUTTERING WITH COLLINATOR CLEANING WITHIN THE SPUTTERING CHAMBER

[75] Inventors: Gurtej S. Sandhu; Sung C. Kim, both of Boise; David J. Kubista, Nampa, all of Id.

[73] Assignee: Micron Technology, Inc., Boise, Id.

[21] Appl. No.: 123,603

[22] Filed: Sep. 16, 1993

[51] Int. Cl.⁶ ............................................. C23C 14/34
[52] U.S. Cl. .................... 204/192.12; 204/298.11; 204/298.06
[58] Field of Search ............. 204/298.11, 298.25, 204/298.26, 192.12, 192.25, 192.3, 298.06; 156/646

[56] References Cited

U.S. PATENT DOCUMENTS

| | | | |
|---|---|---|---|
| 3,699,034 | 10/1972 | Lins et al. | 204/298.11 |
| 4,724,060 | 2/1988 | Sakata et al. | 204/192.12 |
| 5,075,256 | 12/1991 | Wang et al. | 156/646 |
| 5,139,459 | 8/1992 | Takahashi et al. | 204/298.25 |
| 5,202,008 | 4/1993 | Talieh et al. | 204/298.11 |
| 5,294,320 | 3/1994 | Somekh et al. | 204/298.11 |
| 5,362,372 | 11/1994 | Tepman | 204/298.11 |

FOREIGN PATENT DOCUMENTS

| | | | |
|---|---|---|---|
| 0440377 | 8/1991 | European Pat. Off. | 204/298.11 |
| 60-248876 | 12/1985 | Japan | 204/298.11 |

OTHER PUBLICATIONS

"IBM Technical Disclosure" vol. 20 No.3 Aug. 1977 pp. 1177-1178.
"Sputtering Cathode Glow Suppression Shield" Lester and McDonough.

*Primary Examiner*—R. Bruce Breneman
*Assistant Examiner*—Rodney G. McDonald
*Attorney, Agent, or Firm*—Wells, St. John, Roberts, Gregory & Matkin

[57] ABSTRACT

A method of sputtering material onto semiconductor wafers includes: a) providing a sputtering chamber with a sputtering target, a wafer supporting chuck having a supported first wafer, and a collimator positioned between the target and first wafer for filtering material sputtered from the target onto the first wafer; b) providing ionized sputtering atoms within the chamber; c) bombarding the target with the ionized sputtering atoms to dislodge target atoms; d) passing the dislodged target atoms through collimator openings and onto the first wafer, the dislodged target atoms coating the collimator and openings passing therethrough; e) removing the sputter deposited first wafer from the sputtering chamber without breaking vacuum; f) after removing the sputtered first wafer, cleaning the collimator within the chamber without breaking vacuum between removal of the first wafer and the cleaning of the collimator within the chamber; and g) after cleaning of the collimator within the chamber, providing a second wafer on the wafer supporting chuck within the chamber without breaking vacuum between the cleaning of the collimator and the providing of the second wafer in the chamber; and thereafter sputter depositing target atoms onto the second wafer. The cleaning comprises providing the collimator with a negative potential effective to attract bombarding ionized sputtering atoms to dislodgingly clean target atoms from the collimator. The cleaning is to a degree sufficient to render collimator service lifetime at least equal to that of the sputtering target. Other cleaning techniques are disclosed.

6 Claims, 3 Drawing Sheets

SPUTTERING WITH COLLIMATOR CLEANING WITHIN THE SPUTTERING CHAMBER

TECHNICAL FIELD

This invention relates specifically to sputter deposition methods in providing films on semiconductor wafers, with the sputtering methods employing a collimator.

BACKGROUND OF THE INVENTION

Sputtering is a method of depositing thin metal and insulating films onto semiconductor wafers. Sputtering is a term used to describe a physical mechanism in which atoms are dislodged from the surface of a material by collision with high energy particles. It can be compared to throwing steel balls at a concrete wall. Upon impact, the ball tears away fragments of the concrete, resulting in fragments which retain the chemical and physical properties of the concrete. If the process is continued, surfaces in the vicinity of the impact are covered with a layer of concrete dust. In sputtering, the "steel balls" are ionized atoms, typically argon, and the "wall" is a plate of material to be sputtered, commonly referred to as the "target".

Sputtering takes place in an evacuated chamber. Ionized argon atoms are introduced into the chamber which contains the wafers and a target of the film material to be sputtered. In diode sputtering, the target is maintained at a negative potential relative to the positively charged argon atom. This causes the positive ion to be accelerated towards the negatively charged target. The argon atoms slam into the target, thus tearing off some of the target material. Since the chamber is maintained at a vacuum, the liberated material settles on everything in the chamber, including wafers positioned therein. Two kinds of diode sputtering methods include direct current and radio frequency sputtering. Other sputtering methods include the triode and magnetron methods. Regardless of the method, ionized atoms are caused to accelerate toward the target, thus shearing material therefrom at the atomic level and depositing very thin films on semiconductor wafers and everything else in the sputtering chamber.

One drawback of sputtering is the difficulty in achieving conformal coverage deep within high aspect ratio steps or contacts on semiconductor wafers. The problem is described with reference to FIG. 1. Such illustrates a semiconductor wafer fragment 10 comprised of a bulk substrate material 12 having a deep contact opening 14 formed therein. In sputtering, the trajectory of the atomic material sputtered from the target depends in significant part upon the incident angle of the bombarding atom. Accordingly, atoms directed towards the wafer surface come from varying angles, only a comparatively small portion of which arrive at the wafer surface in a substantially perpendicular angle. The downwardly directed arrows shown in FIG. 1 are representative of the varying angles with which the depositing atoms strike the wafer. Such provides an undesired drawback of not conformally coating deep within contacts, as the quantity of perpendicularly angled atoms is small in comparison to the other angled atoms. This results in what is commonly known as a bread-loafing, non-conformal deposit of a metal layer 16, as shown.

To overcome such drawback, a device known as a collimator is used, such as is diagrammatically represented in FIG. 2 with reference numeral 18. Collimator 18 typically comprises a disk-shaped object having a plurality of round holes or openings 20 provided therethrough. A collimator functions effectively as a filter, essentially allowing only the perpendicularly angled atoms to pass therethrough and coat wafer 12. This results in a more conformal deposition within deep contacts than is possible when a collimator is not used. Layer 17 depicts such a deposited layer.

Collimators, like everything else within a sputtering chamber, of course also get coated with the sputtering material. Such results in the effect illustrated by FIG. 3. Collimator 18 gets coated with the sputtered deposited material 16 producing balled-up gatherings 16a of material 16. This at some point effectively diminishes the diametric size of openings 20 to where the deposition rate on a wafer 12 becomes unsatisfactory. Existing techniques involving collimators require them to be removed and cleaned such that sputtering can continue in a desired manner and rate.

Unfortunately, it is a tedious and costly job of cleaning collimators. The sputtering chamber must be effectively shut down and vacuum broken such that the collimators can be removed for cleaning. Presently, the service lifetime of a collimator is typically one-third that of the typical replacement life for a target in sputter deposition methods in semiconductor wafer processing.

It would be desirable to provide methods or techniques for increasing collimator lifetime to a point where such at least equals that of the target lifetime, enabling coincident servicing of the target and collimator.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. patent laws "to promote the progress of science and useful arts" (Article 1, Section 8).

In accordance with an aspect of the invention, a method of sputtering material onto semiconductor wafers comprises:

providing a sputtering chamber having a sputtering target, a wafer supporting chuck having a first wafer supported thereon, and a collimator positioned between the target and first wafer for filtering material sputtered from the target onto the first wafer;

providing ionized sputtering atoms within the sputtering chamber;

bombarding the target with the ionized sputtering atoms to dislodge target atoms;

passing the dislodged target atoms through openings in the collimator and onto the first wafer, the dislodged target atoms coating the collimator and openings passing therethrough;

removing the sputter deposited first wafer from the sputtering chamber without breaking vacuum;

after removing the sputter deposited first wafer, cleaning the collimator within the sputtering chamber without breaking vacuum between removal of the first wafer and the cleaning of the collimator within the sputtering chamber; and after cleaning of the collimator within the sputtering chamber, providing a second wafer on the wafer supporting chuck within the sputtering chamber without breaking vacuum between the cleaning of the collimator and the providing of the second wafer in the sputtering chamber; and thereafter sputter depositing target atoms onto the second wafer.

Figure 4:
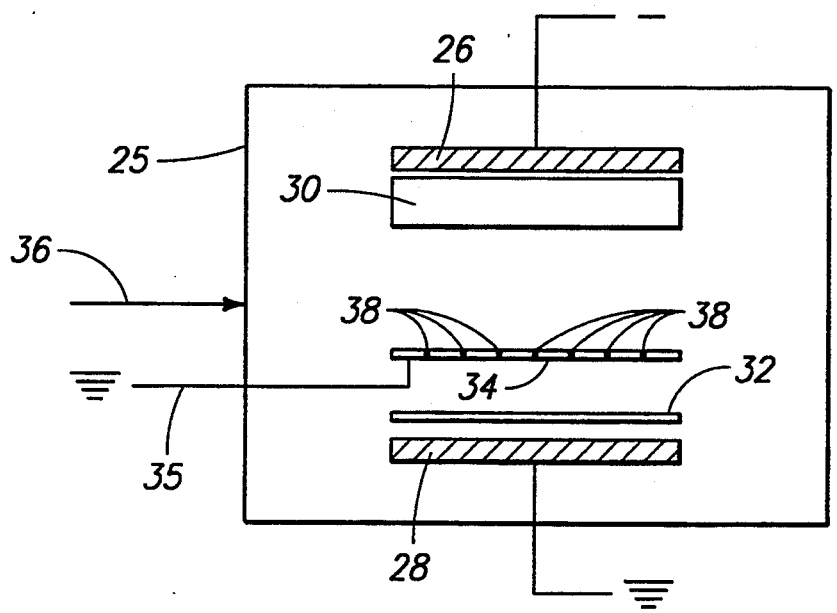
FIG. 4 is a diagrammatic representation of a method in accordance with invention.

More particularly and with reference to the figures, FIG. 4 diagrammatically illustrates a sputtering chamber comprising a target supporting chuck backing plate assembly 26 and a wafer supporting chuck 28. A target block 30, such as elemental titanium metal, is diagrammatically shown supported by target support 26, while a semiconductor wafer 32 is diagrammatically shown supported by wafer supporting chuck 28. A collimator 34 is positioned between target 30 and wafer 32 for filtering material sputtered from target 30 onto to wafer 32 for purposes described above.

In the illustrated diode sputtering technique, conductive target chuck 26 and correspondingly target 30 are connected to a negative potential, whereas collimator 34 and wafer supporting chuck 28 would be connected to ground. The sidewalls of the chamber 25 would either be connected to ground, or electrically isolated such that their voltage is allowed to "float" between ground and some voltage less than the applied negative potential. Line 35 represents a conductor for providing desired potential to collimator 34.

A sputtering medium, preferably argon, is provided via line 36 within chamber 25. The argon atoms are then ionized during a typical sputtering process and bombard the target to dislodge target atoms. The dislodged target atoms pass through openings 38 in collimator 34 and onto wafer 32. The dislodged target atoms also undesirably coat collimator 34 and openings 38 passing therethrough.

Upon achieving a desired deposition upon semiconductor wafer 32, it is removed from chamber 25 without breaking vacuum within chamber 25. Such is typically and conventionally achieved utilizing an intervening airlock chamber (not shown).

After removing the sputter deposited wafer from chamber 25, the collimator is cleaned within the sputtering chamber without breaking vacuum between removal of wafer 32 and the collimator cleaning step within the sputtering chamber. The cleaning is effective or sufficient to dislodge sufficient target material from collimator openings 38 such that subsequent sputtering can occur at a desired and predictable rate onto a subsequent wafer to be sputtered. After the collimator has been so cleaned, a second wafer is provided on wafer supporting chuck 28 within sputtering chamber 25 without breaking vacuum between the time of cleaning of the collimator and the providing of the second wafer in the sputtering chamber. Thereafter, the second wafer is subjected to sputter deposition utilizing target 30 and the cleaned collimator 34.

Figure 1:
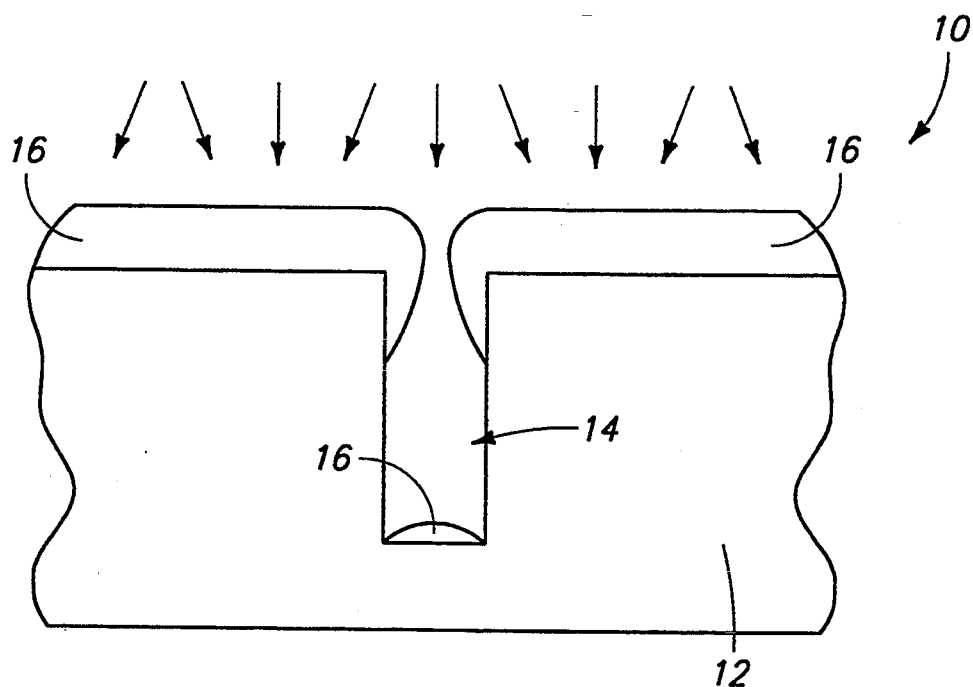
FIG. 1 is a diagrammatic representation of a prior art sputtering method and is described in the "Background" section above.
Figure 2:
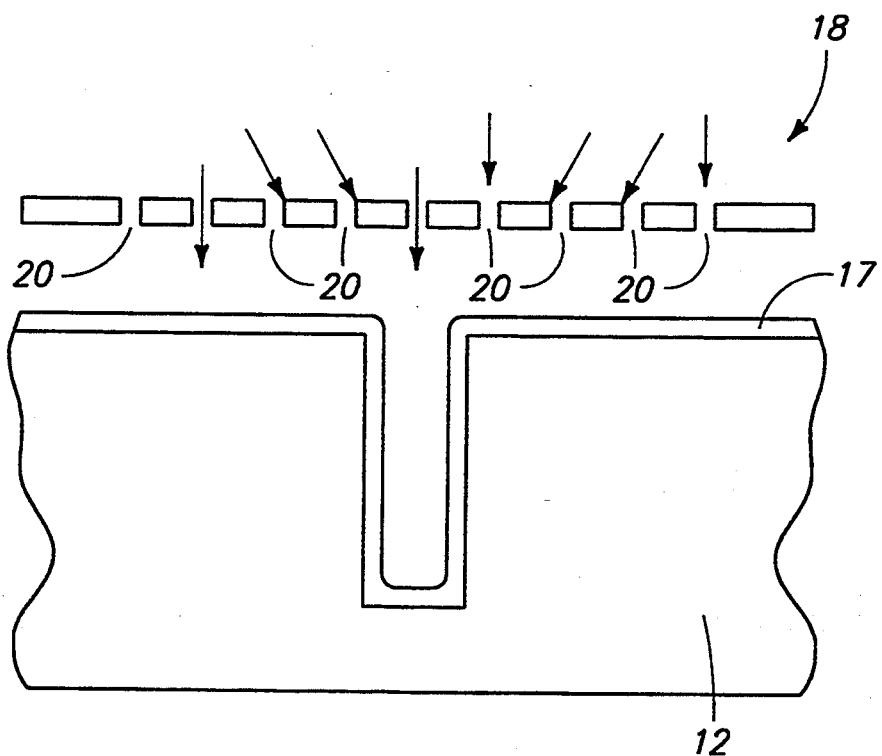
FIG. 2 is a diagrammatic representation of another prior art sputtering method and is described in the "Background" section above.
Figure 3:
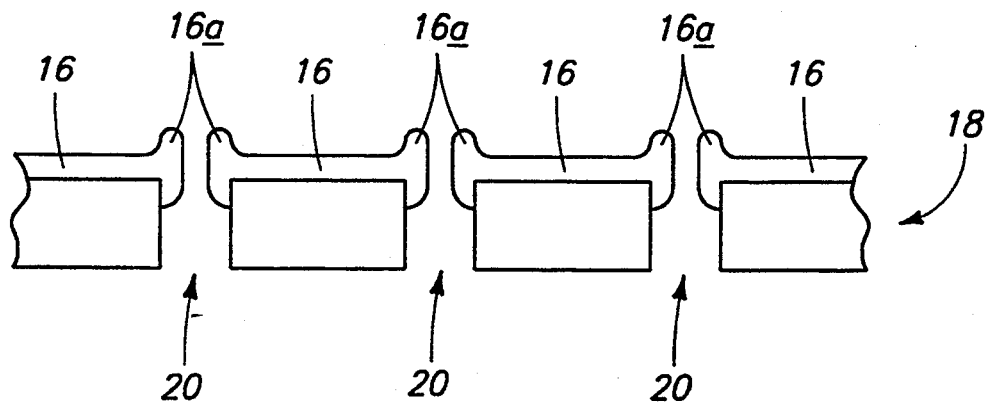
FIG. 3 is a diagrammatic representation of an aspect of the prior art sputtering method of FIG. 2, and is an enlargement relative to FIG. 2.
Figure 5:
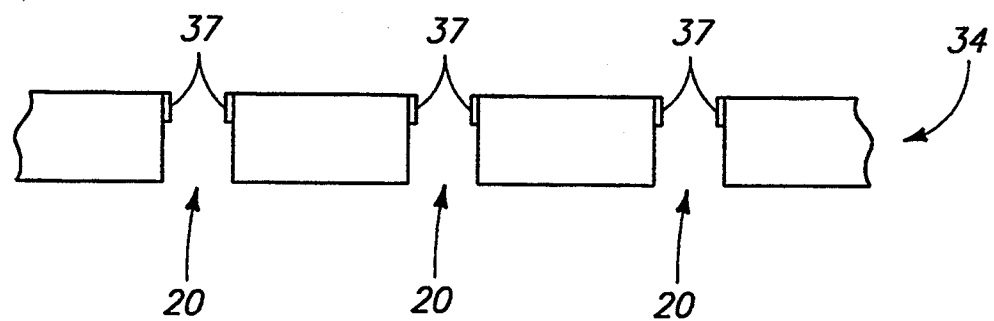
FIG. 5 is a diagrammatic enlargement of a portion of FIG. 4.

Two preferred collimator cleaning techniques are disclosed. In a first and believed to be most preferred process, the coated collimator is subjected to a negative potential via line 35 under typical sputtering conditions which is effective to attract bombarding ionized sputtering atoms to impinge upon the coated collimator. The target is preferably at ground, while preferably the wafer chuck voltage is allowed to float or provided at the same negative potential as that of the collimator. The attracted bombarded ionizing sputter atoms sputter dislodgingly clean target atoms from the collimator, thus cleaning the collimator openings. FIG. 3 illustrates the typical bailing effect from sputtering resulting in enlarged portions 16a which encroach inwardly to significantly reduce the effective diameter of openings 20. FIG. 5 illustrates the same collimator 34 after sputter cleaning in accordance with the invention. After cleaning in accordance with the above-described technique, sputter deposited material is removed from atop collimator 34, and the balling mass of sputter material is sufficiently removed such that only small portions 37 of sputter material remain within openings 20. It will be appreciated, however, that openings 20 have been reopened to a larger dimension than they were previously shrunk by the previous sputter process. Such a technique is effective to increase the collimator service lifetime by at least a factor of three, whereby the collimator can be removed from the sputtering chamber at the same frequency as the target is serviced. Preferably and as described, collimator 34 is cleaned within chamber 25 in its in situ deposition position, diagrammatically as represented in FIG. 4.

Typical conventional sputtering conditions would subject a target to a potential of 300–600 volts, with remaining components within the sputter chamber being subjected to ground. Ionized argon gas would be injected into the reactor at a typical flow rate of 50–200 sccm. Pressure and temperature during deposition would typically be maintained at between 0.5 and 10 Torr, and between 25° and 600° C., respectively. Such an example technique is utilizable with a M2000 sputtering system manufactured by the Varian company of Palo Alto, Calif. Similar conditions would be utilized in cleaning collimator 34, with the collimator being subjected via line 35 to an example negative potential of 100–600 volts, the target maintained at ground, and the wafer chuck voltage being allowed to float or be equal to the collimator voltage. Of course under such conditions, sputter removed materials from collimator 34 will deposit throughout wafer chamber 25.

Figure 6:
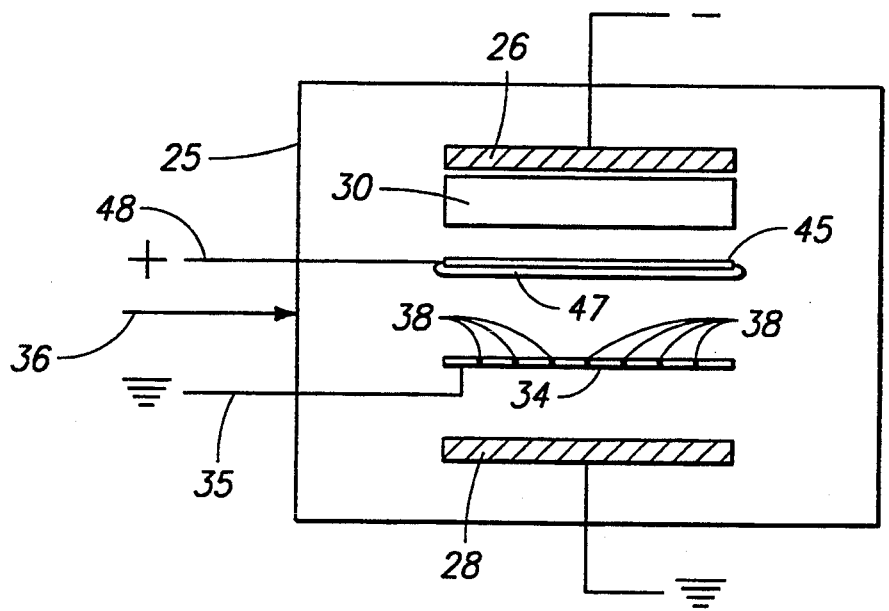
FIG. 6 is a diagrammatic representation of an alternate method in accordance with invention.

An alternate technique for collecting sputter dislodged target material from collimator 34 during cleaning is illustrated in FIG. 6. In accordance with this aspect of the invention, a collection shutter 45 is provided between target 30 and collimator 34 for collecting cleaned target atoms from collimator 34. This will in significant part shield target 30 from deposition of sputter cleaned target atoms from collimator 34. The effect is typically deposition of a layer 47 of sputter cleaned target atoms, as shown. It might be desirable to attract sputter cleaned atoms away from the target during cleaning in the event reapplication of target material onto the target provides an undesired coating on the target. Shutter 45 would preferably constitute a stainless steel, with elemental metals or alloys of for example Al and Ti being less preferred.

If desired although not believed to be preferred, shutter 45 can be provided with a greater potential than that of collimator 34, as indicated by line 48, with the potential being effective to attract a significant quantity of collimator dislodged target atoms to the shutter.

Shutter 45 would be positioned within chamber 25 when collimator 34 was being cleaned, and removed from chamber 25 when normal sputter deposition was occurring.

An alternate cleaning technique would comprise injecting an etching gas into the reactor, with the etching gas being effective to etchingly clean target atoms from the coated collimator. The skilled artisan would be able to select desired etching gases dependent upon the target material desired to be removed from the collimator. For example where the target deposited material comprises one or more of Al, Ti or TiN, the effective component of the etching gas will comprise one or more of, by way of example only, $NF_3$, $CF_4$ or $SF_6$. Such might be provided in pure flow rate to the reaction chamber, or diluted with a carrier gas, such as argon or helium. The gases during cleaning might be subjected to plasma conditions within chamber 25, such as 300 watts, a temperature from 75° C. to 125° C., and an etching gas flow rate of 50 sccm, for a six-liter reaction chamber.

Such chemical etching for cleaning of collimator 34 should sufficiently remove all deposited material, such that opening reducing material 35 shown in FIG. 5 would not be present with a chemical etching step. However, one potential other drawback with this chemical etching clean would be the undesired etching of material from the target, which naturally will comprise the same material as that coated on the collimator. To avoid such drawback in a plasma etch, plasma density can be confined to the collimator so that most of the etching takes place on the collimator.

Whether electronic sputter cleaning, chemical etch cleaning, or other technique, such would most preferably be conducted in between each sputter deposition, with each such cleaning process taking typically only taking 20 seconds.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of sputtering material onto semiconductor wafers comprising:
   providing a sputtering chamber having a sputtering target, a wafer supporting chuck having a wafer supported thereon, and a collimator positioned between the target and first wafer for filtering material sputtered from the target onto the wafer, the collimator having a series of collimator openings, the collimator openings having an original cross sectional size and shape;
   providing ionized sputtering atoms within the sputtering chamber;
   bombarding the target with the ionized sputtering atoms to dislodge target atoms;
   passing the dislodged target atoms through the collimator openings and onto the wafer, the dislodged target atoms coating the collimator and openings passing therethrough and thereby changing the size and shape of the collimator openings;
   removing the sputter deposited first wafer from the sputtering chamber without breaking vacuum;
   after removing the sputter deposited first wafer and without breaking vacuum, providing the coated collimator with a negative potential effective to attract bombarding ionized sputtering atoms to sputter clean target atoms from the collimator, and continuing with the sputter cleaning without breaking vacuum for a period of time effective to remove only a portion of the coated target atoms from within the collimator openings thereby changing the size and shape of the collimator openings to a size and shape differing from their original size and shape; and
   after cleaning of the collimator within the sputtering chamber, providing a second wafer on the wafer supporting chuck within the sputtering chamber without breaking vacuum; and thereafter sputter depositing target atoms onto the second wafer.

2. The method of sputtering material onto semiconductor wafers of claim 1 wherein the step of providing the collimator with a negative potential for collimator cleaning comprises a step of cleaning the collimator within the chamber in the collimator's in situ deposition position.

3. The method of sputtering material onto semiconductor wafers of claim 1 wherein the step of cleaning comprises providing a target atom collection shutter within the sputtering chamber during the cleaning step.

4. The method of sputtering material onto semiconductor wafers of claim 3 wherein the collection shutter is positioned between the collimator and target during cleaning.

5. The method of sputtering material onto semiconductor wafers of claim 1 wherein the step of providing the collimator with a negative potential for collimator cleaning further comprises holding the target at ground voltage, and allowing voltage of the wafer chuck to float.

6. The method of sputtering material onto semiconductor wafers of claim 1 wherein the step of providing the collimator with a negative potential for collimator cleaning further comprises holding the target at ground voltage, and holding the wafer chuck at a voltage equal to the collimator potential.

* * * * *